United States Patent
Carson et al.

[11] Patent Number: 6,107,890
[45] Date of Patent: Aug. 22, 2000

[54] DIGITAL PHASE COMPARATOR AND FREQUENCY SYNTHESIZER

[75] Inventors: Mark Brian Carson, Belfast; Andrew Brown, Carrickfergus, both of United Kingdom

[73] Assignee: Nortel Networks Corporation, Montreal, Canada

[21] Appl. No.: 09/305,634

[22] Filed: May 5, 1999

[51] Int. Cl.[7] .......................... G01R 25/00; H03D 13/00; H03L 7/091
[52] U.S. Cl. ................... 331/17; 327/7; 327/9; 327/12; 331/1 A; 331/25
[58] Field of Search ................. 331/1 A, 17, 25, 331/27; 327/7, 9, 12

[56] References Cited

U.S. PATENT DOCUMENTS

| | | | |
|---|---|---|---|
| 4,504,799 | 3/1985 | Elmis et al. | 331/1 A |
| 5,084,669 | 1/1992 | Dent | 328/133 |
| 5,307,020 | 4/1994 | Marcuard | 327/7 |
| 5,519,343 | 5/1996 | Britz | 327/106 |
| 5,781,044 | 7/1998 | Riley et al. | 327/105 |
| 5,818,304 | 10/1998 | Hogeboom | 331/11 |

FOREIGN PATENT DOCUMENTS

| | | |
|---|---|---|
| 0 316 543 A2 | 5/1989 | European Pat. Off. . |
| 0 450 817 A2 | 10/1991 | European Pat. Off. . |
| 0 475 468 A2 | 3/1992 | European Pat. Off. . |
| WO 96/01007 | 1/1996 | WIPO . |

OTHER PUBLICATIONS

V. Reinhardt et al, "A Short Survey of Frequency Synthesizer Techniques" 40th Annual Frequency Control Symposium—1986, pp. 335 to 365 IEEE.

*Primary Examiner*—Siegfried H. Grimm
*Attorney, Agent, or Firm*—Lee, Mann, Smith, McWilliams, Sweeney & Ohlson

[57] ABSTRACT

The phase of a pulsed test signal is measured with reference to a reference signal of constant frequency by sampling the test signal at times determined by transitions in the reference signal and comparing the sampled test signal with the output of a phase accumulator clocked by the reference signal. A resulting measurement signal represents a difference in the number of transitions occurring in the sampled test signal and a reference state signal output by the phase accumulator. The measurement signal may be averaged and integrated to obtain an error signal which may then be filtered to provide a control signal for an oscillator. A digital frequency synthesizer is provided by frequency dividing the output of the oscillator by a constant multiple to obtain the test signal and integrating an offset signal in addition to the averaged measurement signal so that the operating frequency of the oscillator is offset from a nominal frequency by an amount determined by the offset signal. The digital frequency synthesizer is suitable for use in a synchronous equipment timing source within a telecommunications multiplexer operating at a line transmission rate of 155.52 MHz.

27 Claims, 9 Drawing Sheets

PHASE COMPARATOR INCLUDING A COUNTER

PHASE LOCKED LOOP

PHASE COMPARATOR WITH SAMPLING ON BOTH + AND − TRANSITIONS OF CR

DIGITAL PHASE COMPARATOR AND FREQUENCY SYNTHESIZER

INTRODUCTION

This invention relates to a digital phase comparator and to a digital frequency synthesizer primarily but not exclusively for use in processing electronic signals in an optical communications system.

BACKGROUND TO THE INVENTION

The use of phase comparators is commonplace in the processing of received signals in communications systems, typically forming part of phase locked loops in clock recovery circuits and frequency synthesizer circuits. Analog phase comparators are well established and are both fast and accurate. For certain applications however, analog phase detectors cannot be utilised since, for example, they cannot directly derive phase information from signals of different frequencies without first dividing the signals to a common frequency.

The output of analog phase detectors is also not suitable for directly driving digital circuits. Consequently, all-digital phase comparators have been utilised in circuits requiring subsequent digital signal processing, as for example disclosed in U.S. Pat. No. 4,504,799.

A commonly used form of digital phase comparator effects comparison of phase by counting over a predetermined time period a number of pulses for a signal under test and comparing it with a count for the same period of pulses of a reference signal, such as derived from a stable clock. A disadvantage of this technique, as discussed in U.S. Pat. No. 5,084,669, is that it provides limited resolution since the count is based on integral numbers of pulses and also there is a trade off between the response time and accuracy because, in order to improve accuracy, the predetermined time period must be extended.

It is also known from U.S. Pat. No. 5,519,343 to utilise a phase accumulator to synthesise a desired frequency by adding at each cycle of a clock signal a phase value to an accumulator value which is reset to zero when the accumulated value reaches a maximum value, one cycle of the output frequency being generated at each reset.

SUMMARY OF THE INVENTION

It is an object of the present invention to provide an improved digital phase comparator capable of achieving a response time comparable with that of analog circuits.

It is a further object of the present invention to provide a digital phase comparator with improved accuracy.

It is a further object of the present invention to provide a digital frequency synthesizer employing an improved digital phase comparator.

According to the present invention there is disclosed a method of measuring the phase of a pulsed test signal having a variable test signal frequency, the phase being measured with reference to a pulsed reference signal having a substantially constant reference signal frequency, the method comprising the steps of;

sampling the test signal at sampling times determined by transition events in the reference signal to obtain a sampled test signal;

driving a phase accumulator clocked by the reference signal to generate a pulsed reference state signal having a predetermined frequency which is related to the reference frequency by a fixed ratio other than unity;

comparing the reference state signal and the sampled test signal; and outputting as a result of the comparison a measurement signal representative of a difference in the number of transitions occurring in the reference state signal and the sampled test signal, whereby the measurement signal provides a measure of said phase difference.

According to a further aspect of the invention there is disclosed apparatus for measuring the phase of a pulsed test signal having a variable test signal frequency, the apparatus comprising;

a reference oscillator operable to produce a reference signal having a substantially constant reference signal frequency;

sampling means operable to sample the test signal at sampling times determined by transition events in the reference signal to obtain a sampled test signal;

a phase accumulator responsive to the reference signal to generate a pulsed reference state signal having a predetermined frequency which is related to the reference frequency by a fixed ratio other than unity; and comparing means operable to compare the reference state signal and the sampled test signal and to output as a result of the comparison a measurement signal representative of a difference in the number of transitions occurring in the reference state signal and the sample state signal, whereby the measurement signal comprises a measure of said phase difference.

According to a further aspect of the invention there is disclosed a digital frequency synthesizer comprising;

an oscillator controlled by an analogue control signal to have a nominal output signal frequency when the control signal is zero;

a digital phase detector operable to output a measurement signal representative of the phase of the output signal relative to a reference signal derived from a stabilised reference signal;

a digital integrator clocked by the reference signal and responsive to the measurement signal to increment a summation value;

means for converting the summation value of the integrator into the analogue control signal; and means for generating an offset signal input to the integrator to selectively increment the summation value such that the control signal controls the oscillator to operate at a frequency which is offset from the nominal frequency by an amount determined by the offset signal.

Preferred embodiments of the present invention will now be described by way of example only and with reference to the accompanying drawings.

DESCRIPTION OF THE PREFERRED EMBODIMENTS

Figure 1:
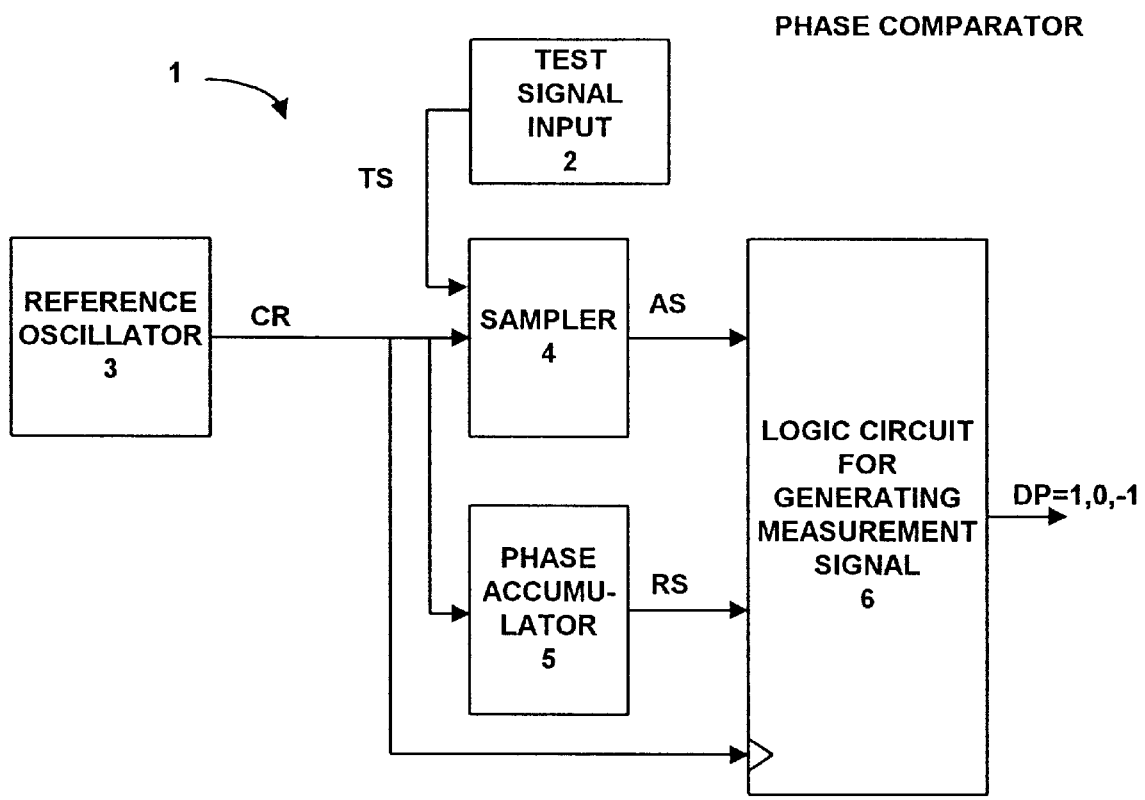
FIG. 1 is a schematic diagram of a phase comparator including a logic circuit.

FIG. 1 illustrates a digital phase comparator 1 in which a test signal TS from a test signal input 2 is subjected to phase comparison relative to a clock reference signal CR from a reference oscillator 3. The frequencies of the test signal TS and clock reference signal CR are different and it is a function of the digital phase comparator 1 to detect fluctuation in the phase or frequency of the test signal TS using the output of the reference oscillator for comparison and to output a phase difference signal DP in the form of a digital signal synchronised with the clock reference signal CR.

In the present example, the test signal TS has a frequency of 19.44 MHz which is greater than the frequency of the reference oscillator 2 which is stable frequency of 16.384 MHz. The test signal TS is sampled in a sampler 4 at the frequency of reference signal CR to produce an aliased clock signal AS which, in the absence of error in the test signal TS, has a frequency of 3.056 MHz. The aliased clock signal AS is referred to as being aliased since it is the product of sampling the test signal TS at a sampling frequency which is lower than that of the test signal.

The clock reference signal CR is also input to a phase accumulator 5, the output of which will be referred to as a reference state signal RS having a frequency of 3.056 MHz, i.e. the expected value of the frequency of the aliased clock signal, but accurately controlled in frequency relative to the clock reference signal CR.

Both the aliased clock signal AS and the reference state signal RS are input to a logic circuit 6 operating synchronously with the clock reference signal CR to output a value of the phase difference signal DP.

Figure 2:
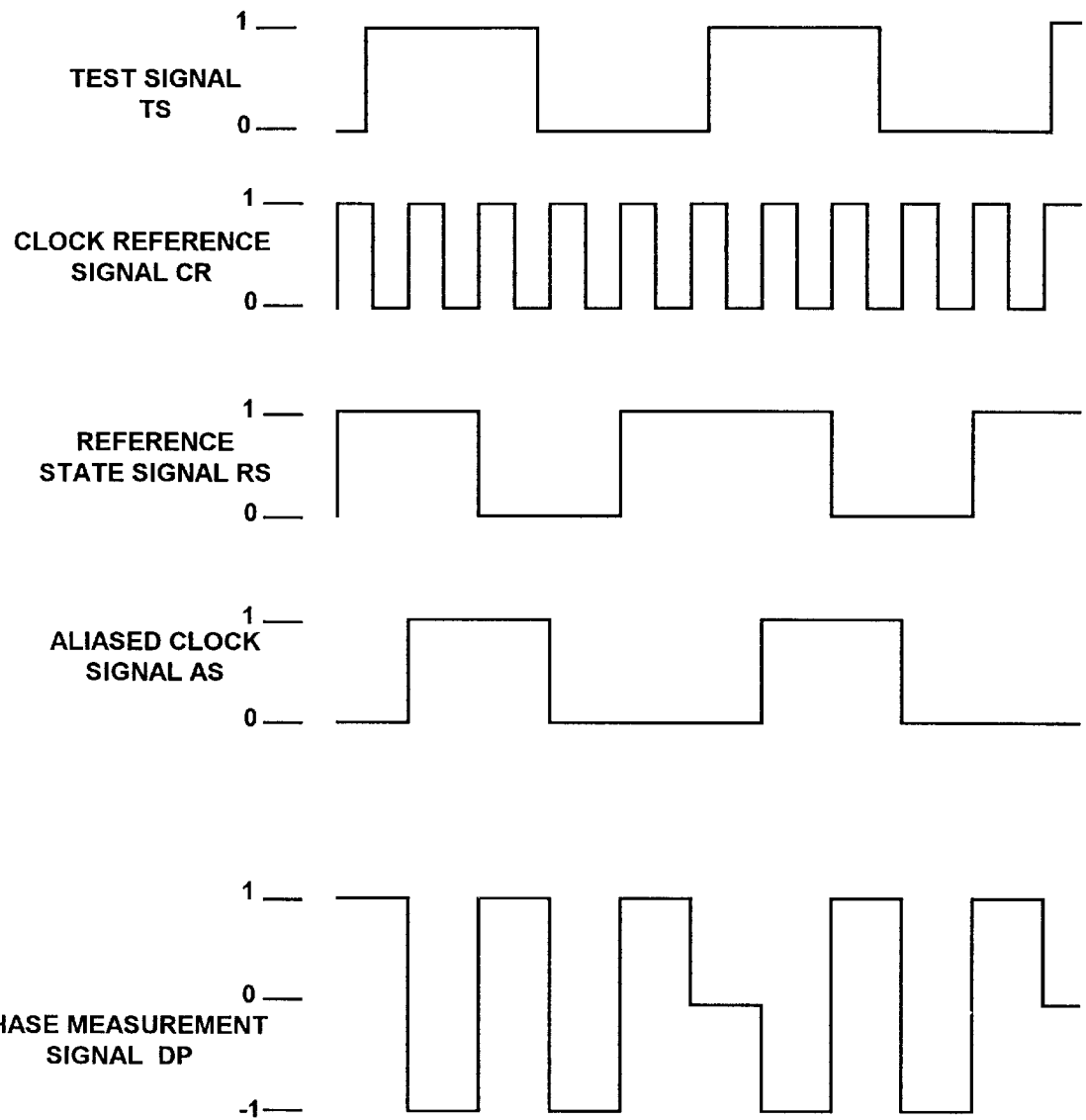
FIGS. 2 and 2A are waveform diagrams illustrating waveforms of signals processed in the circuit of FIG. 1 and the circuit of FIG. 5.

FIG. 2 illustrates graphically the signals of FIG. 1. The clock reference signal CR is a square wave signal which is substantially constant in frequency, being generated by the temperature compensated reference oscillator 3. The sampler 4 operates to sample the test signal TS at each positive going transition of the reference signal to produce the aliased clock signal AS which may be regarded as a binary level signal synchronised with the clock reference signal CR.

The phase accumulator 5 is implemented as a ten bit counter which is incremented by 191 at each positive going transition of the clock reference signal CR, the most significant bit of the counter being output as the reference state signal RS. As illustrated in FIG. 2, the reference state signal RS is a binary waveform which is irregular in shape but for which nevertheless the number of positive going transitions of the reference state signal RS is accurately equal to 3.056 MHz, to a stability determined by the stability of the reference oscillator 3.

The logic circuit 6 operates to detect at sampling times at each positive going transition of the reference signal CR whether any transition occurs in the reference state signal RS and the aliased clock signal AS and outputs a measurement signal DP accordingly. As shown in FIG. 2, for a given sampling time, the phase measurement signal DP has a value of 1 if either a positive or a negative transition occurs in the reference state signal RS in the absence of a simultaneous transition in the aliased clock signal AS. The phase measurement signal DP has a value of −1 if either a positive or negative going transition occurs in the aliased clock signal AS in the absence of a simultaneous transition in the reference state signal RS. If no transition occurs at a given sampling time in either RS or AS, the phase measurement signal DP has zero output. The phase measurement signal DP also has zero output if transitions occur simultaneously in both the reference state signal RS and the sampled test signal AS at a given sampling time.

The time averaged value of the phase measurement signal DP provides therefore a measurement of the phase of the test signal TS such that, a time average of zero indicates that the test signal is matched exactly to the frequency of the reference state signal RS and any error occurring in the frequency of the test signal TS will result in a positive or negative average value of the phase measurement signal DP. Phase information is made available at each cycle of the clock reference signal CR. This information may be utilised in a variety of applications, responsive to a phase change of half of each 19.44 MHz cycle of the test signal TS.

Figure 3:
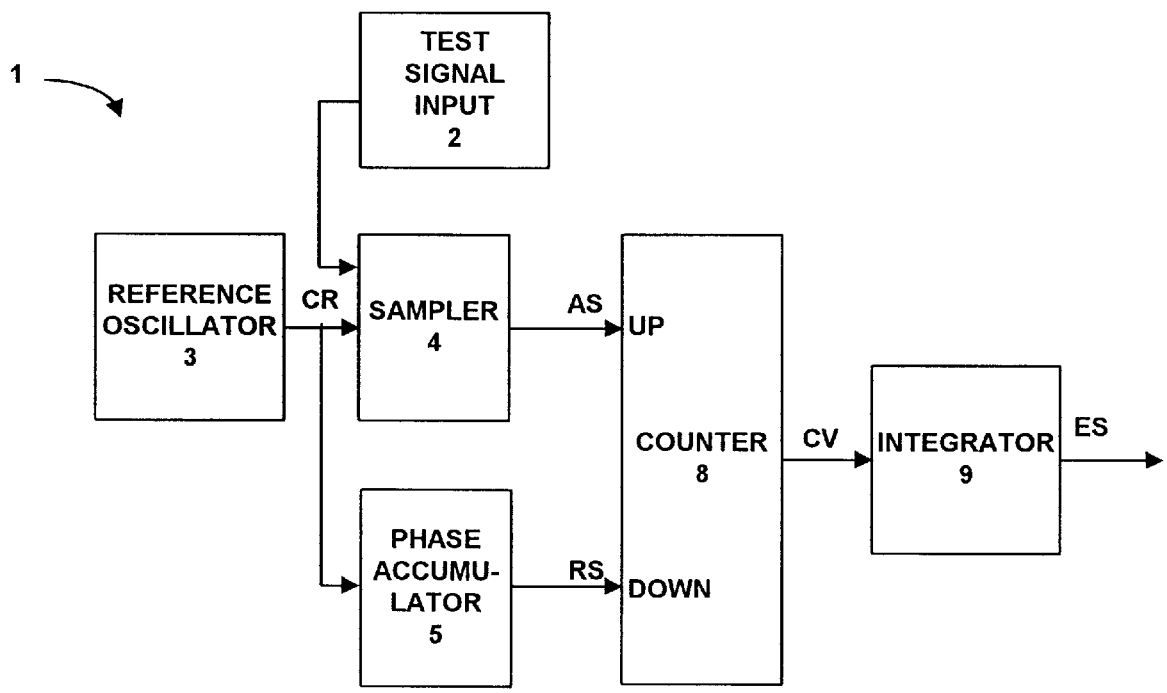
FIG. 3 is a schematic diagram of a further phase comparator with an up-down counter.

FIG. 3 illustrates an alternative arrangement which differs from the phase comparator of FIG. 1 by replacing the logic circuit 6 by an up-down counter 8 which is positively incremented at each transition of the aliased clock signal AS and decremented at each transition of the reference state signal RS. The output from the counter 8 is a count value CV which is input to a digital integrator 9. The count value CV represents the difference in phase of the test signal TS relative to the reference state signal RS so that the output of the integrator 9, when time averaged, will be an absolute measurement of phase.

Figure 4:
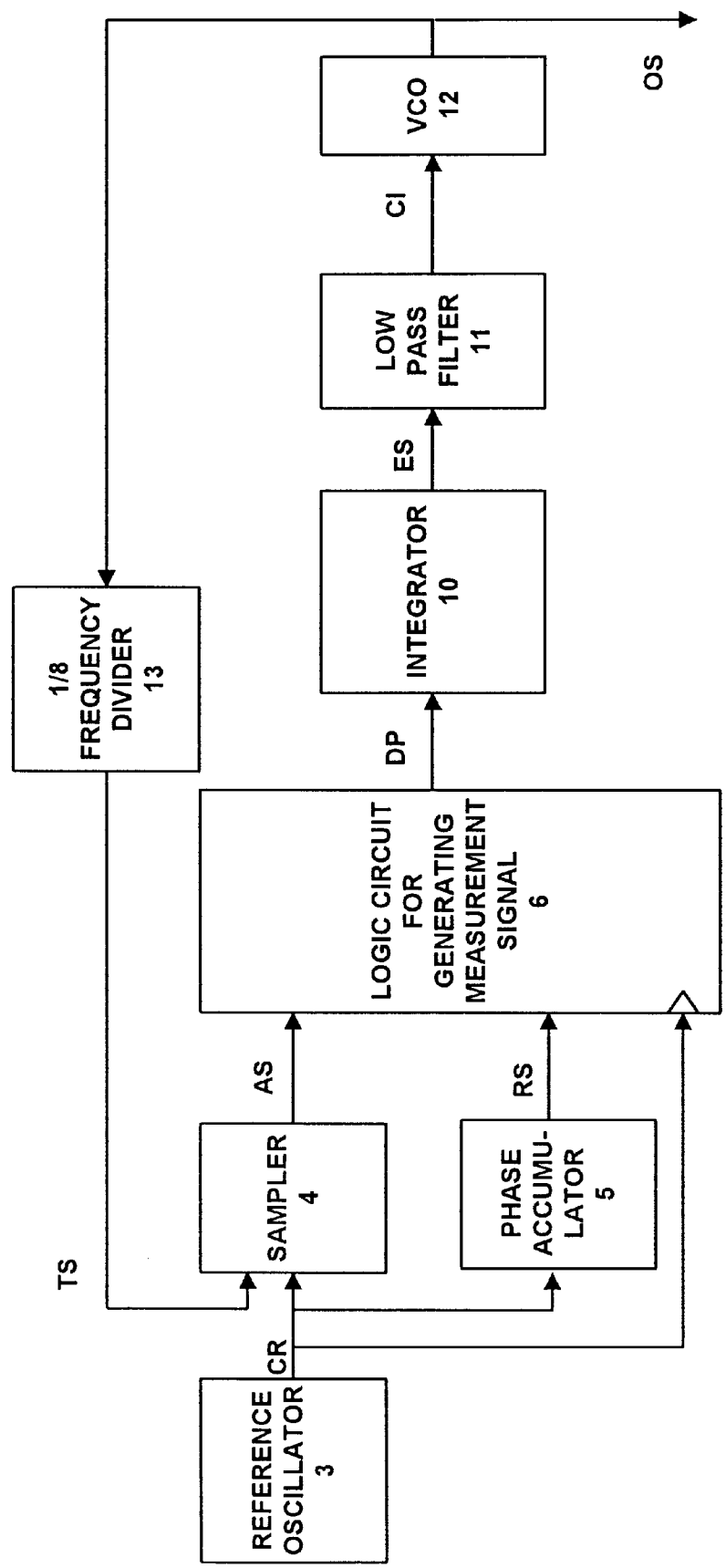
FIG. 4 is a schematic diagram of a phase locked loop incorporating a digital phase comparator.

FIG. 4 illustrates a phase locked loop utilising the phase comparator of FIG. 1, corresponding reference numerals being utilised where appropriate for corresponding elements.

The phase measurement signal DP output from the logic circuit 6 of the phase comparator is input to a digital integrator 10, the output of which is an error signal ES which is filtered in a low pass filter 11 before being used as a control input CI to a voltage controlled oscillator 12.

The voltage controlled oscillator 12 generates a binary waveform having a nominal frequency of 155.52 MHz which is reduced by a frequency divider 13 by a factor of one eighth to generate the test signal TS described above with reference to FIG. 1.

The output of the integrator 10 is a binary signal having value zero when the integrand of the integrator is positive and having the value one when the integrand is negative. This binary signal is converted to an analog signal by the low pass filter 11 which removes high frequency noise.

The voltage controlled oscillator 12 responds to the control input CI to adjust the frequency of output signal OS in a direction which reduces CI, thereby stabilising the frequency of the output signal OS to a frequency of 155.52 MHz. The circuit of FIG. 4 is therefore useful in applications where a single stable output frequency is required, the frequency and phase stability of the output signal being determined relative to a reference oscillator having a clock reference signal CR which is dissimilar from the output signal OS. It is not necessary for the output signal OS to be an integral multiple of the clock reference signal CR, the relationship between the frequencies being determined by the configuration of the phase accumulator 5 and frequency divider 13.

Figure 2A:
Figure 5:
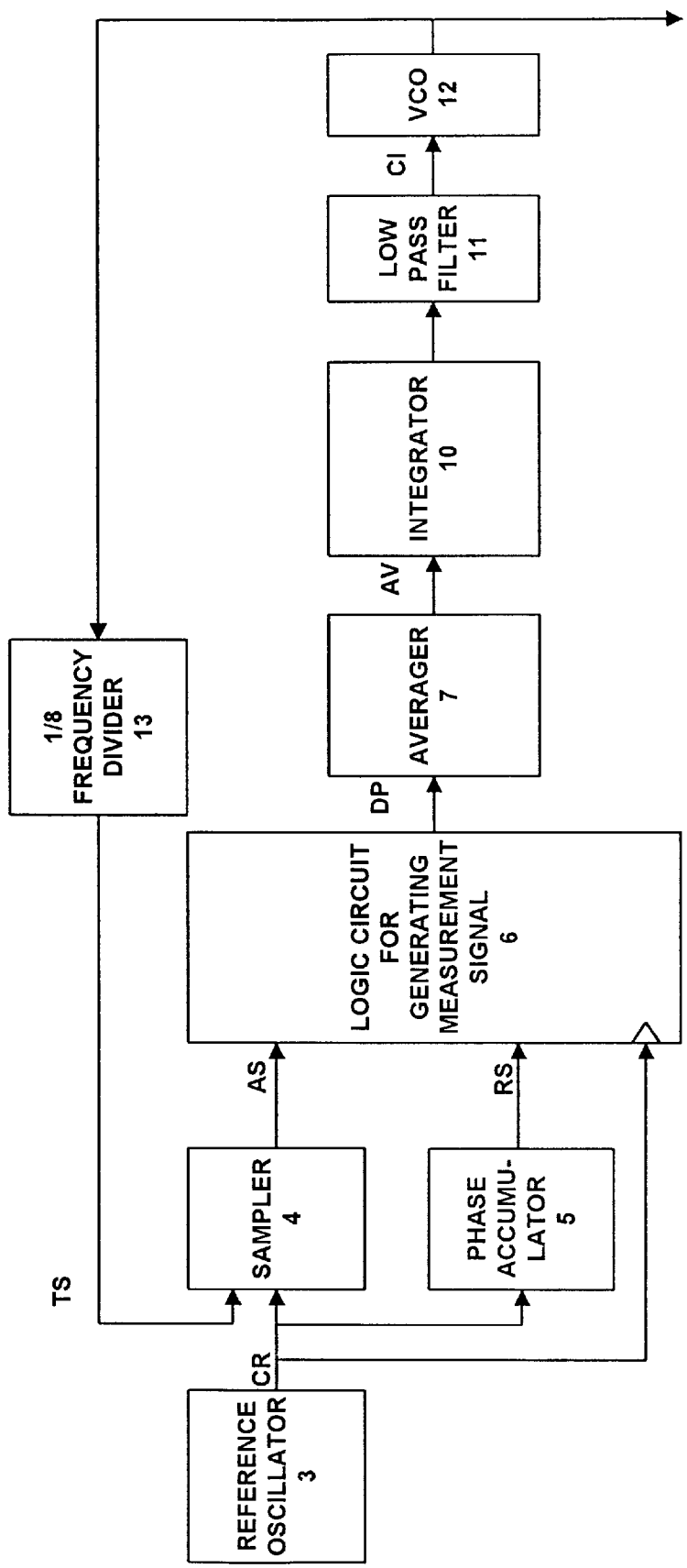
FIG. 5 is a schematic diagram of a further phase locked loop including an averager.

FIG. 5 illustrates an alternative phase locked loop similar to the arrangement of FIG. 4 and which will be described using corresponding reference numerals where appropriate. The phase locked loop of FIG. 5 inputs the phase measurement signal DP to an averager 7 which outputs an averaged measurement signal AV having a waveform as shown in FIG. 2A. The averaged measurement signal is determined at each positive going transition of the clock reference signal CR to be the average value of the phase measurement signal DT over the preceding two cycles of the clock reference signal, i.e. the previous two values of the phase measurement signal. The averaged measurement signal AV is a three bit binary signal which is input to the digital integrator 10. The integrator output is filtered by the low pass filter 11 before being input as the control input signal CI to the voltage controlled oscillator 12. Since the available values of the average measurement signal AV are −1, −1.5, 0, 1.5 and 1, the use of the averager 7 provides increased resolution in the determination of the control input CI.

More generally, an averager as illustrated in FIG. 5 operates to calculate an average over an averaging block of n sample values of the phase measurement DP. The n=2 example illustrated in FIG. 2A is the simplest arrangement which will provide improved resolution by a factor of 2. Extending the average block to n samples will increase the resolution by a factor of n, the value of a being generally an integral power of 2.

Figure 6:
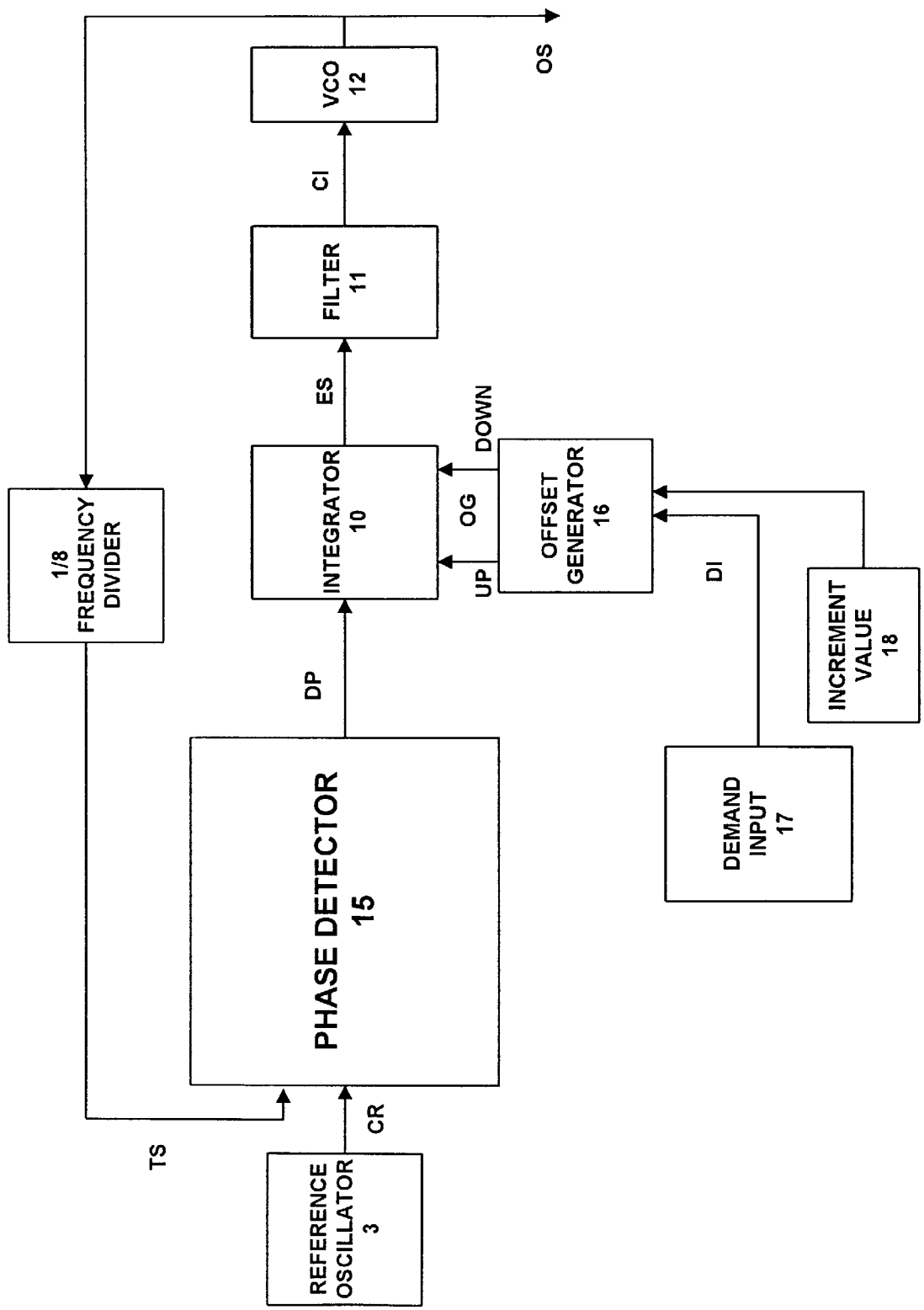
FIG. 6 is a schematic diagram of a frequency synthesizer.

FIG. 6 illustrates a frequency synthesizer which incorporates a phase detector 15 representing any one of the digital phase comparator circuits referred to in preceding figures for presenting the input signal DP or AV to the integrator 10.

The frequency synthesizer of FIG. 6 has a voltage controlled oscillator 12 of which the frequency of operation is stabilised by operation of a phase locked loop relative to the stable clock reference signal CR, any phase error being detected by the phase detector 15 and nulled by the effect of the error signal ES and control input CI on the oscillator 12.

In order to variably select the stabilized frequency of output signal OS from the voltage controlled oscillator 12, an additional input to the integrator 10 is provided by an offset generator 16. The offset generator 16 outputs pulses OG to either increment or decrement the integrand of the integrator 10, the frequency with which such pulses are generated being determined by a demand input signal DI from a demand input 17. The effect of a constant stream of "UP" pulses OG is to increase the average output of the integrator 10 and hence to raise the level of the control input CI to the voltage controlled oscillator 12. The effect of a constant stream of "DOWN" pulses OG is to decrease the average output of the integrator 10. In this way, the frequency of the output signal OS can be offset by a predetermined amount relative to the nominal value of the frequency of the output signal in the absence of pulses OG.

In this example, the offset generator 16 is a three bit counter used in signed notation and counting from −4 to +3. The counter is incremented by an external clock pulse provided by the signal DI from the demand input 17. The counter generates a positive to negative transition at every eight clock pulses, the resulting positive to negative transition being used to increment or decrement the integrator 10 by outputting the up or down pulse OG as required. An increment value input 18 contains a set value determining the amount by which the offset generator counter 16 is incremented at each cycle of the demand input DI. The amount by which the voltage controlled oscillator 12 is offset in operating frequency from the nominal frequency is determined therefore both by the frequency of the demand input signal DI and the increment value 18.

In this way the voltage controlled oscillator 12 can be driven at any desired frequency different from the clock reference signal CR while at the same time being stabilised using digital phase detection in which the phase information is measured and processed in synchronism with the clock reference signal CR.

Figure 7:
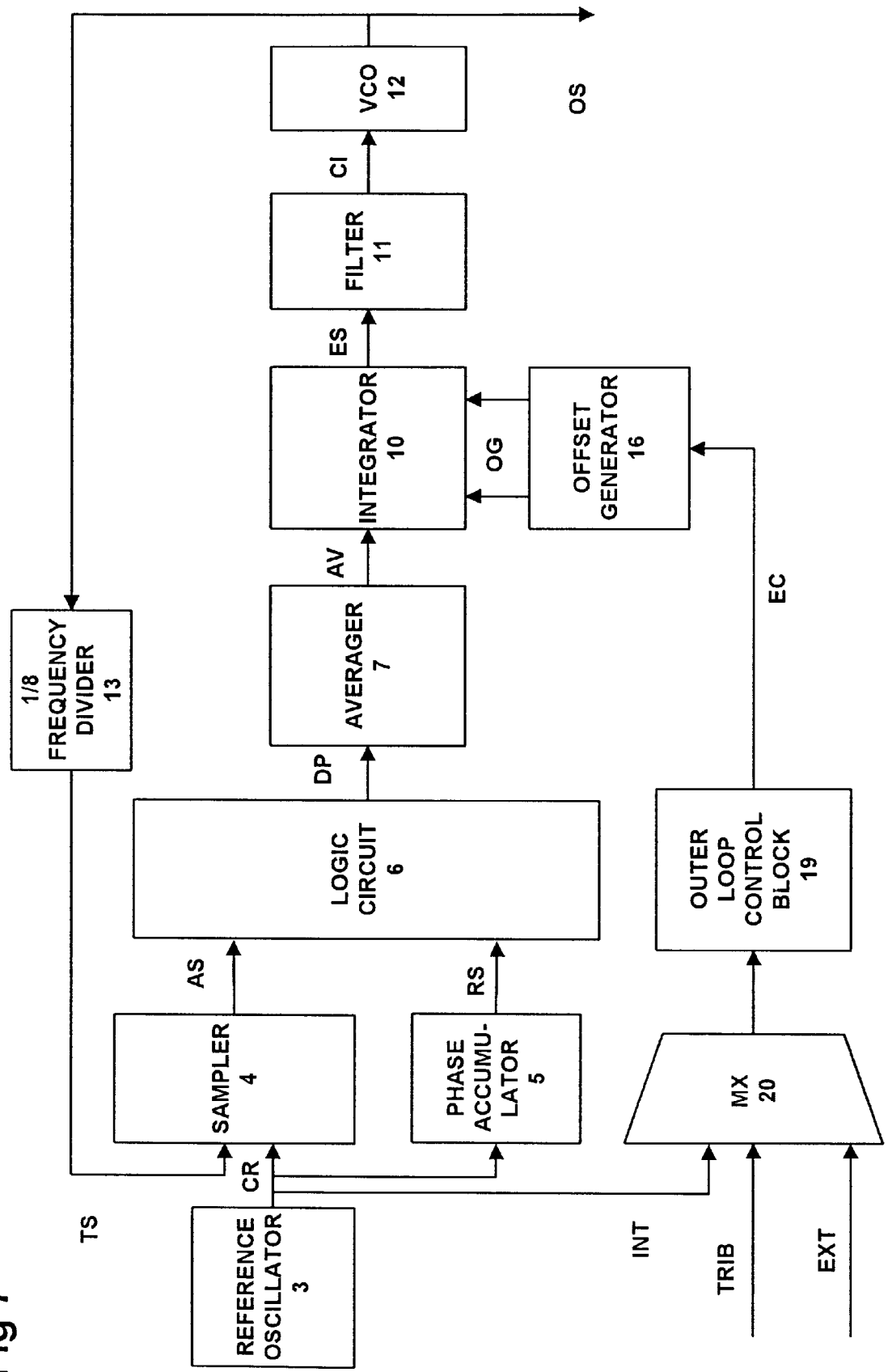
FIG. 7 is a schematic diagram of a further frequency synthesizer showing in greater detail the phase comparator.

FIG. 7 illustrates a further example of a frequency synthesizer, similar to the synthesizer of FIG. 6 but in which the phase detector 15 is replaced by a specific example similar to that of FIG. 5. Corresponding reference numerals are used where appropriate for corresponding elements in preceding figures.

The frequency synthesizer of FIG. 7 includes a reference oscillator 3 providing clock reference signal CR at 16.384 MHz and driving a phase accumulator 5 which outputs a reference state signal RS having a frequency of 3.056 MHz. Test signal TS is input to a sampler 4 where it is sampled at each positive transition of the clock reference signal CR, the test signal TS being derived from the output signal OS via the one eighth frequency divider 13.

Logic circuit 6 generates phase measurement signal DP in response to the input of the reference state signal RS and the aliased clock signal AS output from the sampler 4. Averager 7 provides improved resolution by a factor n of the phase measurement signal DP and outputs an averaged measurement signal AV which is input to an integrator 10.

The output of the integrator 10 is a binary level error signal ES which is filtered in a low pass filter 11 to provide an analogue control input signal CI to the voltage controlled oscillator 12.

Figure 9:
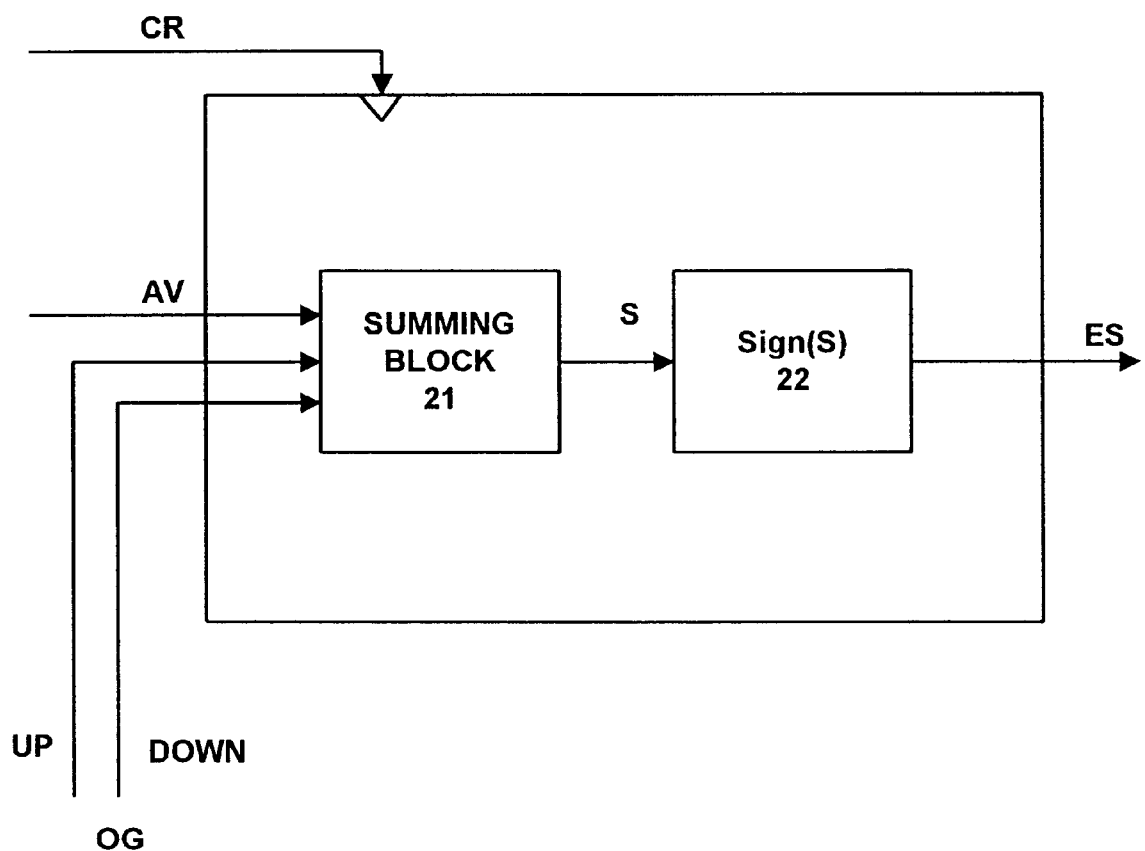
FIG. 9 is a schematic representation of the integrator of FIG. 7.

FIG. 9 illustrates schematically the integrator 10 which is a digital circuit clocked by the clock reference signal CR and including a summing block 21 which maintains an integrand by summation of input numerical values. The output of the summing block is an integrand signal S, the sign of which is extracted by sign block 22 which outputs the error signal ES in the form of a binary signal representative of whether the integrand is positive or negative.

An offset generator 16 as shown in FIG. 7 is operable to input pulses OG to the integrator 10 for incrementing or decrementing the integrand in order to set an offset in the stable oscillating frequency of the voltage controlled oscillator 12 relative to its nominal frequency of operation. The offset generator 16 is driven by an outer loop control block 19 which variably determines the frequency with which the pulses OG are input to the integrator 10. The outer loop control block 19 transmits an external clock signal EC to the offset generator 16 for this purpose, thereby enabling pulses OG from the offset generator to be input at regular intervals to the integrator 10. The frequency of EC is determined according to user requirements and, in the synthesizer of FIG. 7, a multiplexer 20 allows one of three possible external clock signals to be selected. Input to the multiplexer 20 is an internal signal INT equal to the clock reference signal CR, an external input of 8 KHz, TRIB, and a further external signal at 2.048 MHz "EXT". This selection of inputs to the multiplexer 20 corresponds to an application of the frequency synthesizer of FIG. 7 in a synchronous equipment timing source within an STM-1 telecommunications multiplexer operating at a line transmission rate of 155.52 MHz.

Figure 8:
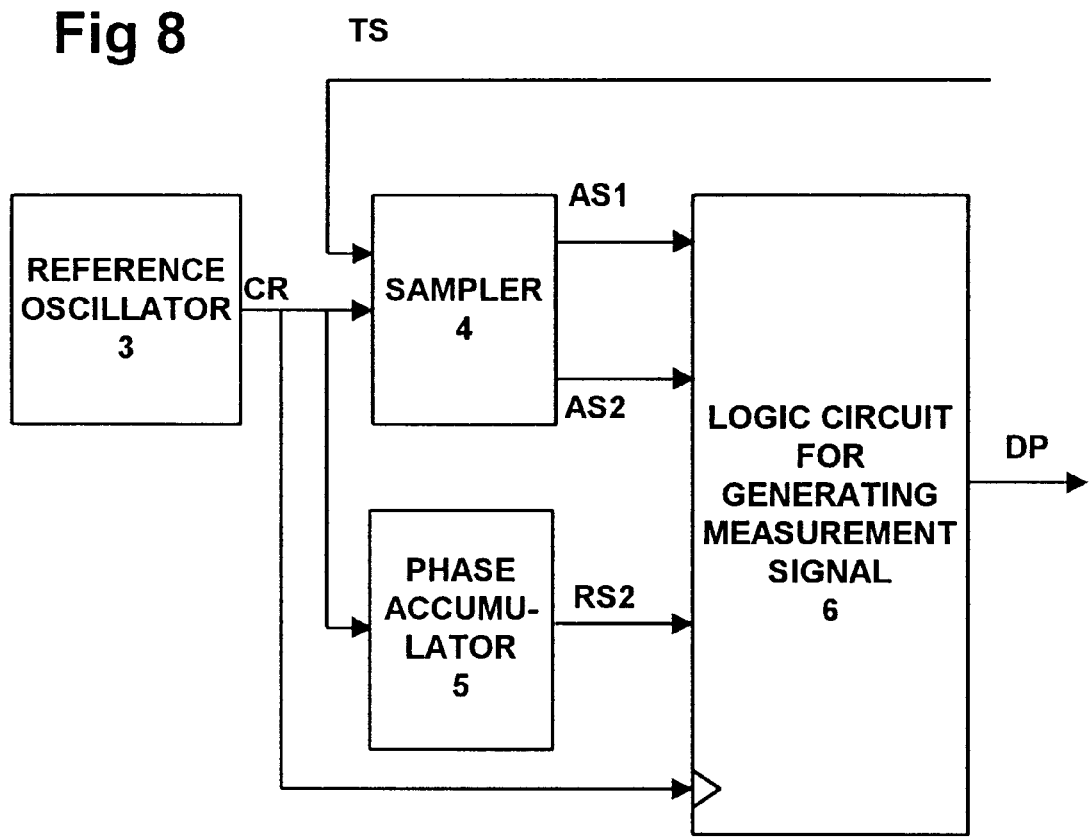
FIG. 8 is a schematic diagram of an alternative phase comparator sampling the test signal on both positive and negative transitions of the clock reference signal.

In each of the above described embodiments, the accuracy of phase detection and subsequent frequency control may be doubled by operating the sampler 4 so as to sample the test signal TS on both positive and negative transitions of the clock reference signal CR. As shown in FIG. 8, two aliased clock signals AS1 and AS2 are produced, corresponding to sampling on the positive and negative transitions respectively, and are input to the logic circuit 6. The count of transitions within logic circuit 6 is incremented if a transition is detected on either one of the aliased clock signal AS1 and AS2 and incremented by 2 if transitions are detected simultaneously on both. The phase accumulator 5 outputs a reference state signal RS2 having a frequency which is twice that of the frequency required when only single transitions are sampled, i.e. 6.112 MHz. The phase accumulator 5 for this embodiment may similarly comprise a ten bit counter but taking the output from the 9th bit of the counter instead of from the tenth bit as in the case of previous embodiments.

What is claimed is:

1. A method of measuring the phase of a pulsed test signal having a variable test signal frequency, the phase being measured with reference to a pulsed reference signal having a substantially constant reference signal frequency, the method comprising the steps of;

sampling the test signal at sampling times determined by transition events in the reference signal to obtain a sampled test signal;

driving a phase accumulator clocked by the reference signal to generate a pulsed reference state signal having a predetermined frequency which is related to the reference frequency by a fixed ratio other than unity;

comparing the reference state signal and the sampled test signal; and outputting as a result of the comparison a measurement signal representative of a difference in the number of transitions occurring in the reference state signal and the sampled test signal, whereby the measurement signal provides a measure of said phase difference.

2. A method as claimed in claim 1 wherein the comparing step comprises comparing the number of transition events in the sampled test signal and the reference state signal occurring at each of the sampling times whereby respective values of the measurement signal are output in synchronism with said reference signal.

3. A method as claimed in claim 1 including the step of averaging the measurement signal at each sampling time with a predetermined number of successive preceding measurement signals to obtain an averaged measurement signal.

4. A method as claimed in claim 3 wherein the averaged measurement signal is an average of two successive measurement signals.

5. A method as claimed in claim 3 wherein the averaged measurement signal is an average of n successive measurement signals where n is an integral power of 2.

6. A method as claimed in claim 3 including an integrating step of summing the averaged measurement signals and outputting an error signal representative of the result of summation.

7. A method as claimed in claim 6 wherein the error signal is a binary signal representative of a sign of a value of the summation obtained in the integration step.

8. A method as claimed in claim 6 including a filtering step of low pass filtering the error signal to obtain a control signal.

9. A method as claimed in claim 2 wherein the comparing step comprises inputting the sampled test signal and the reference state signal to respective inputs of a counter, incrementing a count value of the counter for each transition of a selected one of the signals and decrementing the count value for the other one of the signals, and outputting said measurement signal representative of the count value.

10. A method as claimed in claim 1 wherein the sampling step samples the test signal at sampling times determined by transition events constituted by both positive and negative transition of the reference signal.

11. A method as claimed in claim 1 wherein the reference signal frequency is less than twice the test signal frequency whereby the sampled test signal is an aliased signal.

12. A method as claimed in claim 1 wherein the phase accumulator is a counter and wherein the reference state signal is derived from transitions in a signal representative of a selected bit of a count value of the counter.

13. A method as claimed in claim 8 including the step of controlling a frequency of an oscillator with the control signal and deriving the test signal from an output signal of said oscillator such that an output signal frequency of said output signal is a constant multiple of said test signal frequency.

14. Apparatus for measuring the phase of a pulsed test signal having a variable test signal frequency, the apparatus comprising;

a reference oscillator operable to produce a reference signal having a substantially constant reference signal frequency;

sampling means operable to sample the test signal at sampling times determined by transition events in the reference signal to obtain a sampled test signal;

a phase accumulator responsive to the reference signal to generate a pulsed reference state signal having a predetermined frequency which is related to the reference frequency by a fixed ratio other than unity; and comparing means operable to compare the reference state signal and the sampled test signal and to output as a result of the comparison a measurement signal representative of a difference in the number of transitions occurring in the reference state signal and the sample state signal, whereby the measurement signal comprises a measure of said phase difference.

15. Apparatus as claimed in claim 14 wherein the comparing means is operable to compare the number of transitions in the sampled test signal and the reference state signal occurring at each of the sampling times whereby the respective values of the measurement signal are output in use in synchronism with said reference signal.

16. Apparatus as claimed in claim 14 comprising averaging means operable to average the measurement signal at each sampling time with a predetermined number of successive preceding measurement signals to obtain an averaged measurement signal.

17. Apparatus as claimed in claim 16 wherein the averaging means is operable to obtain the average of two successive measurement signals.

18. Apparatus as claimed in claim 16 wherein the averaging means is operable to obtain the average of n successive measurement signals where n is an integral power of 2.

19. Apparatus as claimed in claim 16 further comprising integrating means operable to sum the averaged measurement signals and to output an error signal representative of the result of summation.

20. Apparatus as claimed in claim 19 wherein the integrating means is operable to output said error signal as a binary signal representative of a sign of the value of the summation.

21. Apparatus as claimed in claim 19 further comprising filtering means operable to low pass filter said error signal to obtain a control signal.

22. Apparatus as claimed in claim 15 wherein said comparing means comprises a counter operable to increment a count value for each transition of a selected one of the sampled test signal and the reference state signal and to decrement the count value for the other one of said signals, the counter being further operable to output said measurement signal representative of the count value.

23. Apparatus as claimed in claim 14 wherein the sampling means is operable to sample the test signal at sampling times determined by each positive and negative transition of the reference signal.

24. Apparatus as claimed in claim 14 wherein the reference signal frequency is less than twice the test signal frequency whereby the sampled test signal is an aliased signal.

25. Apparatus as claimed in claim 14 wherein the phase accumulator is a counter and wherein the reference state signal is derived from transitions in a signal representative of a selected bit of a count value of said counter.

26. Apparatus as claimed in claim 21 comprising an oscillator having an output signal with an output signal frequency determined by said control signal and frequency dividing means operable to derive said test signal from said output signal such that the output signal frequency is a constant multiple of said test signal frequency.

27. A digital frequency synthesizer comprising;
   an oscillator controlled by an analogue control signal to have a nominal output signal frequency when the control signal is zero;
   a digital phase detector operable to output a measurement signal representative of the phase of the output signal relative to a reference signal derived from a stabilised reference signal;
   a digital integrator clocked by the reference signal and responsive to the measurement signal to increment a summation value;
   means for converting the summation value of the integrator into the analogue control signal; and
   means for generating an offset signal input to the integrator to selectively increment the summation value such that the control signal controls the oscillator to operate at a frequency which is offset from the nominal frequency by an amount determined by the offset signal.

* * * * *